United States Patent
Liao et al.

(10) Patent No.: US 7,841,859 B2
(45) Date of Patent: Nov. 30, 2010

(54) SOCKET WITH SOLDER PAD

(75) Inventors: Fang-Chu Liao, Tu-cheng (TW); Chun-Yi Chang, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 45 days.

(21) Appl. No.: 12/229,012

(22) Filed: Aug. 18, 2008

(65) Prior Publication Data
US 2009/0047805 A1 Feb. 19, 2009

(30) Foreign Application Priority Data
Aug. 18, 2007 (CN) .................. 2007 2 0042961 U

(51) Int. Cl.
*H01R 12/00* (2006.01)
(52) U.S. Cl. .................................................. 439/65
(58) Field of Classification Search .................. 439/65, 439/70, 68, 342, 570, 566; 361/807
See application file for complete search history.

(56) References Cited

U.S. PATENT DOCUMENTS 6,623,298 B2 * 9/2003 Lin et al. ..................... 439/570
6,929,498 B2 * 8/2005 Tan ............................. 439/342

* cited by examiner

*Primary Examiner*—Alexander Gilman
(74) *Attorney, Agent, or Firm*—Andrew C. Cheng; Wei Te Chung; Ming Chieh Chang

(57) ABSTRACT

A socket, for electrically connecting an IC package and a printed circuit board, comprises an insulative housing and a plurality of contacts received in the insulative housing. The insulative housing has an opening in a center thereof, a solder pad is received in the opening and has a soldering board which is soldered to the printed circuit board to enhance a mechanical connection between the socket and the printed circuit board.

9 Claims, 3 Drawing Sheets

SOCKET WITH SOLDER PAD

BACKGROUND OF THE INVENTION

1. Field of the Invention

The present invention relates to a socket, especially to a land grid array (LGA) socket mounted to a printed circuit board and adapted for electrically connecting a semiconductor package.

2. Description of the Related Art

To electrically connect to a printed circuit board, an IC (integrated Circuit) package usually need a socket disposed between the IC package and the printed circuit board and electrically connecting with the IC package and the printed circuit board, respectively, for transferring signals between the IC package and the printed circuit board. And following a trend of the IC package to be miniaturized and have more conductive points, the socket is required to have much more contacts in a small size, which means the contact arranged in a high-density, corresponding. So it becomes a not easy thing to mount the socket to the printed circuit board.

A socket, which mounts to the printed circuit board by BGA (Ball Grid Array), is popular for this type socket can provide a lower impedance and reliably mechanical and electrical performance thereof. This type socket usually comprises an insulative housing, a plurality of passageways through the insulative housing and a plurality of contacts received in the passageways. The contact is formed with a base retained in the passageway, a contacting portion upwardly extending from the base to electrically contacting with the IC package and a solder portion downwardly extending from the base to electrically contacting with the printed circuit board. Solders are disposed on the solder portion, and this assembly process may influence a connecting effect between the socket and the printed circuit board, and also is a main difficulty in technology.

FIG. 1 shows a sectional view of a socket relative to present invention, the socket has an insulative housing 50 and a plurality of contacts 60, the insulative housing 50 has a plurality of receiving slot 501, the contact 60 has a main body 601, a contacting arm 602 upwardly extending from the main body 601 and a solder portion 603 downwardly extending from the main body 601 and soldered to a printed circuit board (not shown). However, a connecting between the socket and the printed circuit board dependents on the contacts 603 soldered to the printed circuit board is not enough reliable, when the socket is crashed by a big outside force or swings, due to an intensity of the solders linking with the printed circuit board is weak, the socket may be destroyed.

Hence, an improved socket is required to overcome the disadvantages of the prior art.

SUMMARY OF THE INVENTION

An object of the invention is to provide a socket with solder pad.

To achieve the above-mentioned object, a socket, adapted for electrically connecting an IC package and a printed circuit board, comprises an insulative housing defining an opening in a center thereof and a plurality of passageways surrounding the opening; a plurality of contacts received in the passageways; and at least one solder pad received in the opening of the insulative housing, the solder pad having a horizontal solder board for being soldering to the printed circuit board.

Other features and advantages of the present invention will become more apparent to those skilled in the art upon examination of the following drawings and detailed description of preferred embodiments, in which:

DETAILED DESCRIPTION OF PREFERRED EMBODIMENT

Reference will now be made in detail to the preferred embodiment of the present invention.

Figure 1:
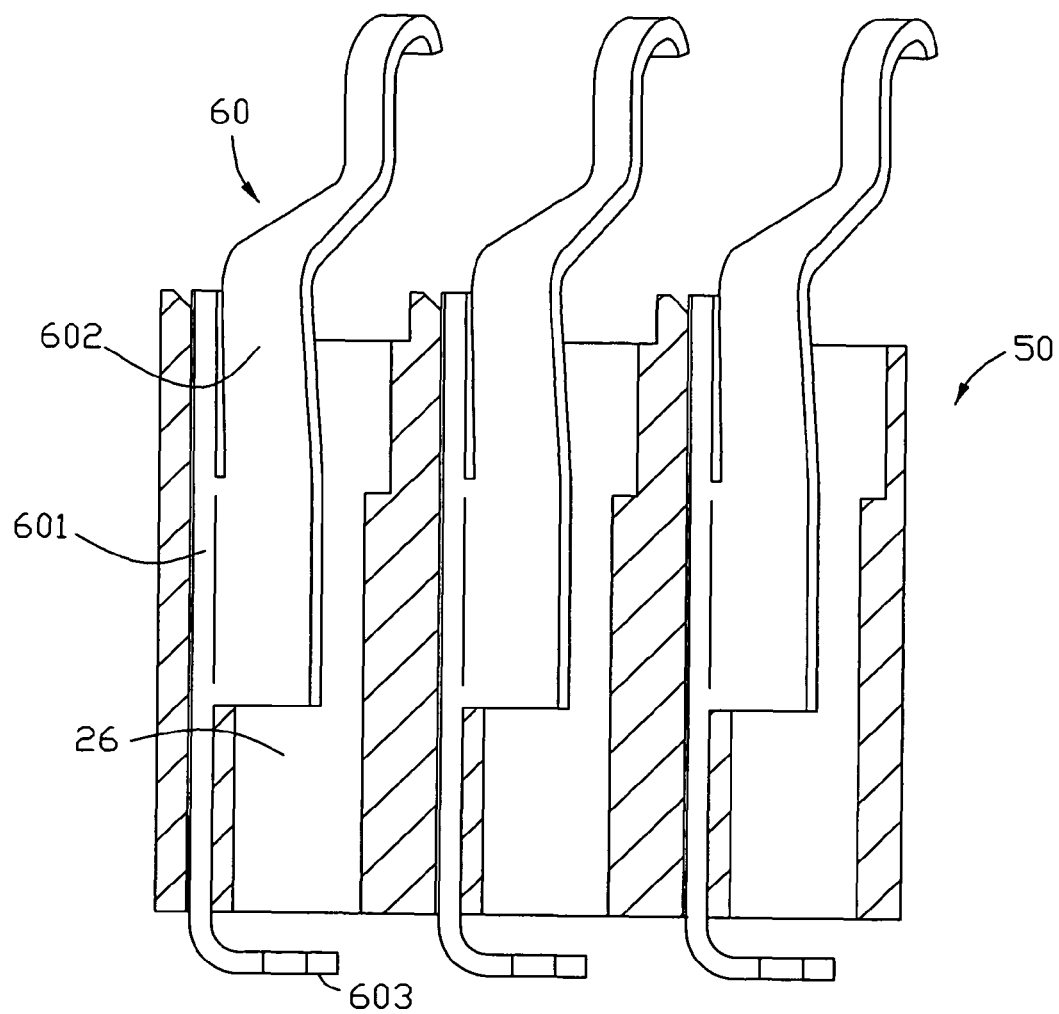
FIG. 1 is a partially sectional view of a socket relative to present invention.
Figure 2:
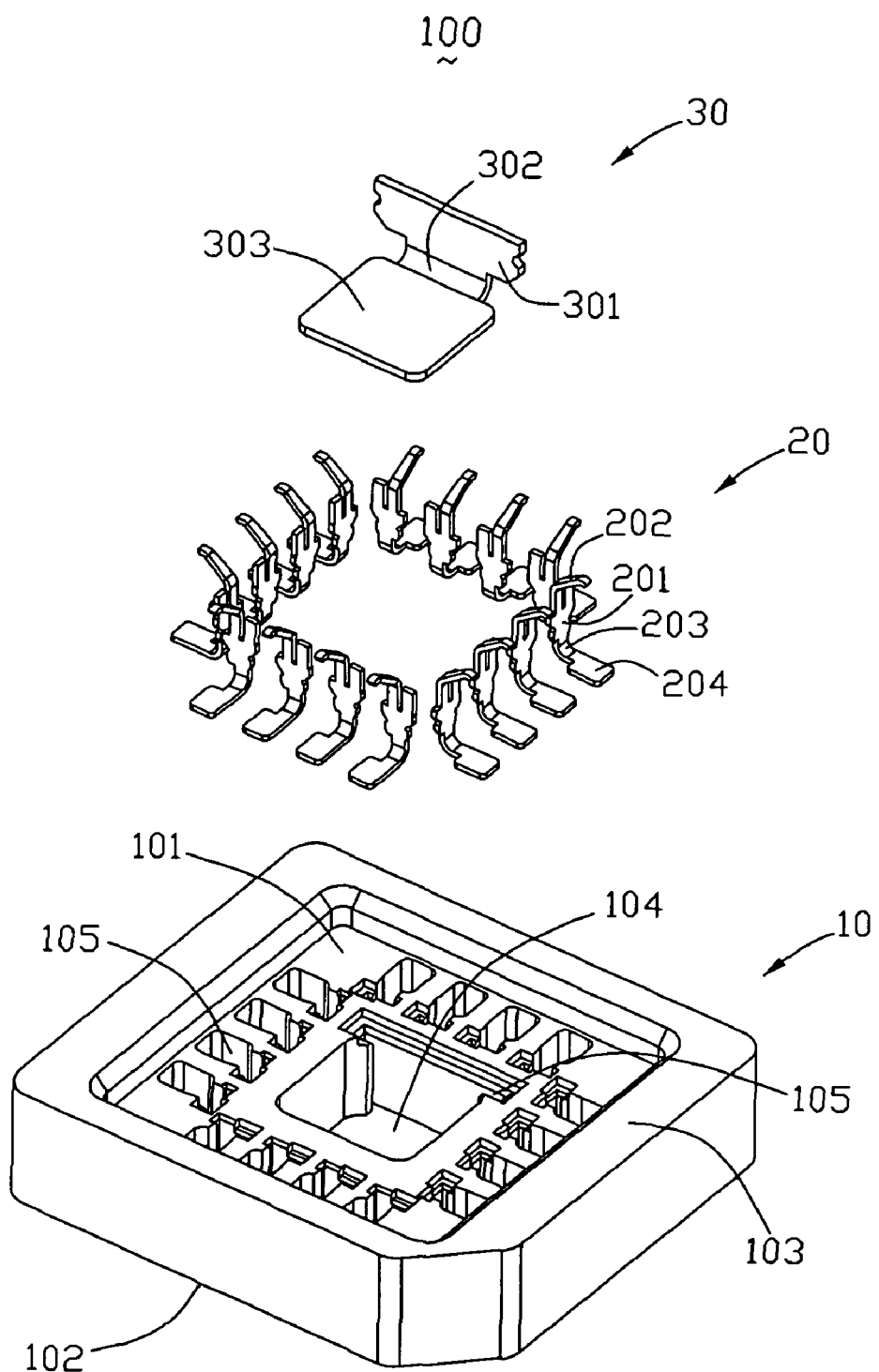
FIG. 2 is an exploded, perspective view of a socket in accordance with a preferred embodiment of present invention.
Figure 3:
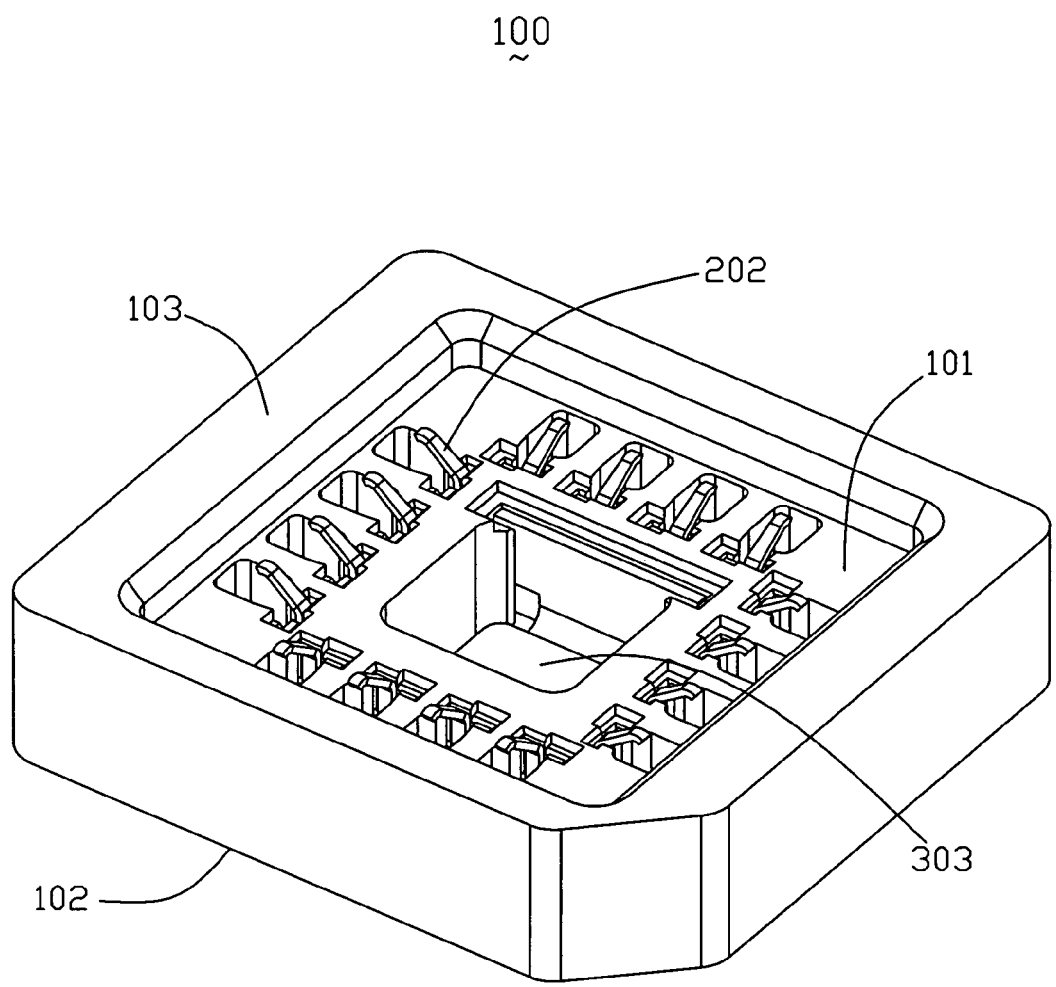
FIG. 3 is an assembled, perspective view of a socket in accordance with a preferred embodiment of present invention.

Referring to FIGS. 1-2, a socket 100 in accordance with a preferred embodiment of present invention is adapted for electrically connecting a first electronic interface, such as IC package (not shown) to a second electronic interface, such as a printed circuit board (not shown), the socket 100 comprises an insulative housing 10, a plurality of contacts 20 and a solder pad 30 assembled to the insulative housing 10.

The insulative housing 10 is substantial rectangle shape, and has a mating surface 101 for supporting the IC package (not shown), a mounting surface 102 opposed to the mating surface 101, and a plurality of continued sidewall 103 vertically and upwardly extending from the mating surface 101. The insulative housing 10 defines an opening 104 in a center thereof and a plurality of passageways 105 around the opening 104 for receiving the contacts 20. The opening 104 has a retaining slot 105 on a side thereof.

The contact 20 has a base 201, a contacting arm 202 upwardly extending from the base 201 for IC package (not shown), a bend portion 203 downwardly extending from the base 201 and a solder portion 204 linked with the bend portion 203 and substantially in a plate-like. The solder portion 204 of the contact 20 mounts to the printed circuit board (not shown) by soldering.

The solder pad 30 is in an L-shape, comprises a vertical mounting portion 301 retaining the solder pad 30 in the opening 104, a plate-like horizontal solder board 303, a linking portion 302 linking with an edge of the solder board 303 and a bottom edge of the mounting portion 301, a size of the solder board 303 is bigger than that of solder portion 204 of the contact 20.

When in assembly, insert the contacts 20 into the passageways 105 of the insulative housing 10, and then put the solder pad 30 in the opening 104 and retain the solder pad 30 to the insulative housing 10 with the mounting portion 301 engaging with the retaining slot 105 of the opening 104, finally, solder the solder portions 204 of the contacts 20 and the solder board 303 of the solder pad 30 to the printed circuit board (not shown). For the solder pad 30 is directly soldered to the printed circuit board (not shown) and enhances a mechanical connection between the socket 100 and the printed circuit board (not shown).

The solder pad 30 can make the socket 100 reliably mounted on the printed circuit board (not shown), in alternative embodiment, the solder pad 30 can further transfer signals.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. A socket, adapted for electrically connecting an IC package and a printed circuit board, comprising:
    an insulative housing defining an opening in a center thereof and a plurality of passageways surrounding the opening;
    a plurality of contacts received in the passageways; and
    at least one solder pad received in the opening of the insulative housing, the solder pad having a horizontal solder board for being soldering to the printed circuit board.

2. The socket as described in claim 1, wherein a size of the solder board is bigger than that of a solder portion of the contact.

3. The socket as described in claim 2, wherein the opening has a retaining slot, and the solder pad has a vertical mounting portion retains the contact in the insulative housing by engaging with the retaining slot.

4. A socket, adapted for electrically connecting an IC package and a printed circuit board, comprising:
    an insulative housing defining a mating surface for supporting the IC package and a mounting surface opposed to the mating surface;
    a plurality of contacts received in the insulative housing; and
    at least one solder pad disposed in a field of the insulative housing without passageways, the solder pad having a horizontal solder board for being soldering to the printed circuit board, wherein
    the insulative housing defines an opening in a center thereof and surrounded by the passageways, the soldering pad is received in the opening.

5. The socket as described in claim 4, wherein a size of the solder board is bigger than that of a solder portion of the contact.

6. The socket as described in claim 5, wherein the opening has a retaining slot on a side thereof, and the solder pad has a vertical mounting portion retains the contact in the insulative housing by engaging with the retaining slot, the horizontal solder board has a substantial same shape with the opening.

7. An electrical connector comprising:
    an insulative housing defining a center vertical through opening surrounded by a plurality of vertically extending passageways;
    a plurality of contacts disposed in the corresponding passageways, respectively, each of said contacts being equipped with a solder section adapted to be surface mounting to an upper surface of a printed circuit board; and
    at least one discrete solder pad fastened to the housing in said center vertical through opening; wherein
    the solder pad includes a horizontal solder plate adapted to be surface mounting to the upper face of the printed circuit board under a condition that the solder plate is much larger than the solder section.

8. The electrical connector as claimed in claim 7, wherein there is only one of said solder pad, and the solder plate is essentially as large as a cross-sectional area of the through opening.

9. The electrical connector as claimed in claim 7, wherein the passageways and the corresponding contacts symmetrically surround the center vertical through opening, and each of said passageways is large enough to fully enclose the solder section of the contact for downwardly investigating said solder section via the corresponding passageway.

* * * * *